(12) United States Patent
Jeon et al.

(10) Patent No.: US 11,837,303 B2
(45) Date of Patent: *Dec. 5, 2023

(54) OPTIMIZING MEMORY ACCESS OPERATION PARAMETERS

(71) Applicant: MICRON TECHNOLOGY, INC., Boise, ID (US)

(72) Inventors: Seungjune Jeon, Santa Clara, CA (US); Tingjun Xie, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/094,554

(22) Filed: Jan. 9, 2023

(65) Prior Publication Data
US 2023/0162810 A1 May 25, 2023

Related U.S. Application Data

(63) Continuation of application No. 17/302,215, filed on Apr. 27, 2021, now Pat. No. 11,557,362.

(51) Int. Cl.
*G11C 29/18* (2006.01)
*G11C 29/44* (2006.01)
*G11C 29/50* (2006.01)
*G11C 29/12* (2006.01)

(52) U.S. Cl.
CPC ........ *G11C 29/18* (2013.01); *G11C 29/12005* (2013.01); *G11C 29/44* (2013.01); *G11C 29/50004* (2013.01)

(58) Field of Classification Search
CPC ... G11C 29/18; G11C 29/12005; G11C 29/44; G11C 29/50004
See application file for complete search history.

(56) References Cited

U.S. PATENT DOCUMENTS

| | | |
|---|---|---|
| 2007/0234162 A1 | 10/2007 | Barth |
| 2015/0029796 A1* | 1/2015 | Choi .................. G11C 11/5642 365/189.05 |
| 2016/0118112 A1* | 4/2016 | Liang .................. G06F 11/0727 714/48 |
| 2016/0306572 A1 | 10/2016 | Ryan |
| 2018/0173447 A1 | 6/2018 | Chin et al. |
| 2019/0189202 A1 | 6/2019 | Avraham et al. |
| 2020/0050383 A1 | 2/2020 | Shen et al. |
| 2022/0199183 A1 | 6/2022 | Seiner et al. |

* cited by examiner

*Primary Examiner* — Mohammed A Bashar
(74) *Attorney, Agent, or Firm* — Lowenstein Sandler LLP

(57) ABSTRACT

A predefined data pattern is written using a plurality of values of a memory access parameter. A corresponding value of a data state metric associated with each value of a plurality of values of the memory access operation parameter is measured. An optimal value of the memory access operation parameter is selected from the plurality of values of the memory access operation parameter.

20 Claims, 4 Drawing Sheets

200

For each value of a plurality of values of a memory access operation parameter, measure a corresponding value of a predefined data state metric associated with the value of the plurality of values of the memory access operation parameter used in one or more memory access operations 210

Determine an optimal metric value based on the measured values of the predefined data state metric 220

Select, based on the optimal metric value, an optimal value of the memory access operation parameter from the plurality of values of the memory access operation parameter 230

FIG. 2

OPTIMIZING MEMORY ACCESS OPERATION PARAMETERS

RELATED APPLICATIONS

The present application is a continuation of application Ser. No. 17/302,215, filed Apr. 27, 2021, which is incorporated by reference herein.

TECHNICAL FIELD

Embodiments of the disclosure relate generally to memory sub-systems, and more specifically, relate to optimizing memory access operation parameters.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 2 is a flow diagram of an example method to optimize memory access operation parameters in accordance with some embodiments of the present disclosure.

DETAILED DESCRIPTION

Figure 1:
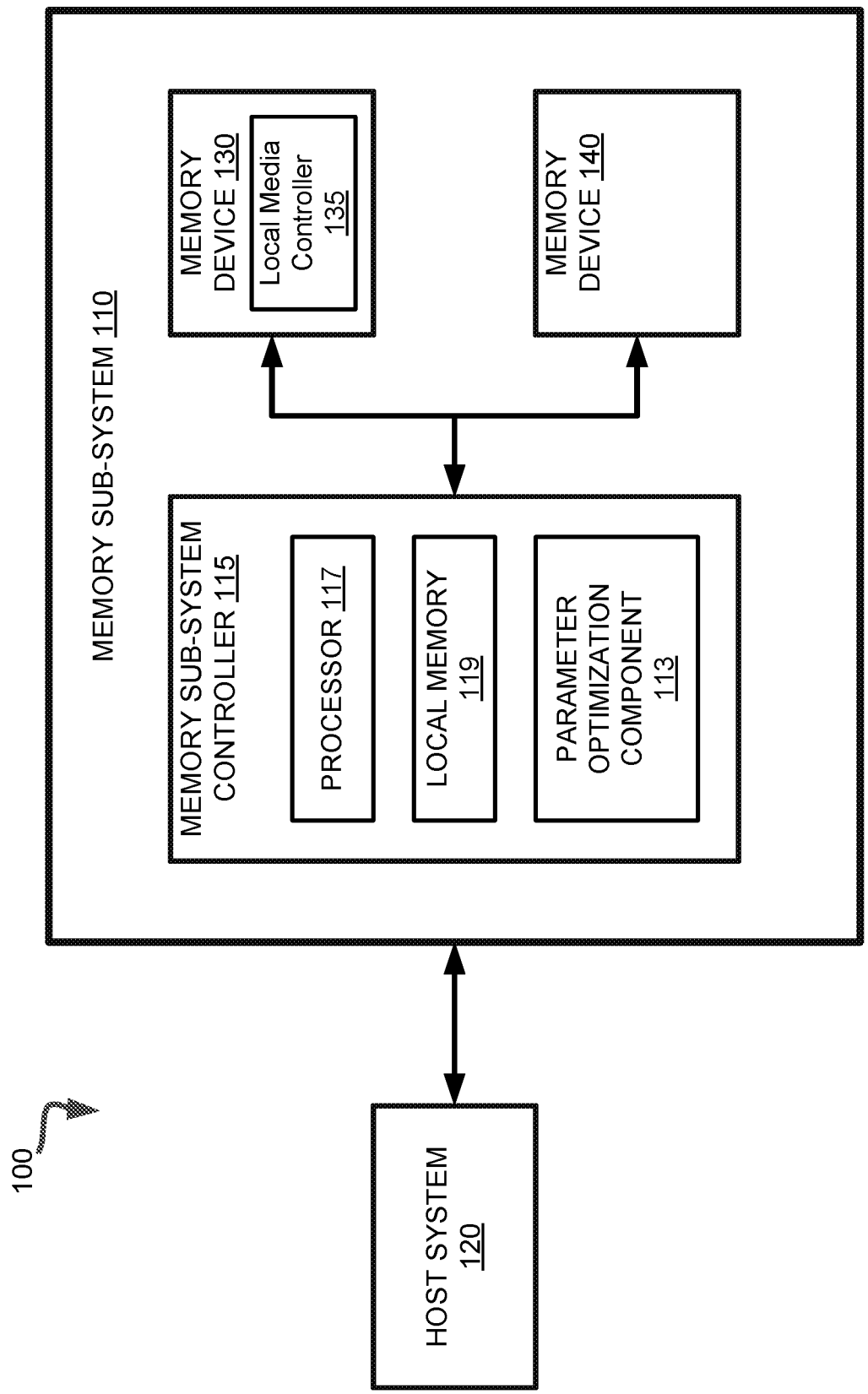
FIG. 1 illustrates an example computing system that includes a memory sub-system in accordance with some embodiments of the present disclosure.

Aspects of the present disclosure are directed to optimizing memory access operation parameters. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values. For example, a single level cell (SLC) can store one bit of information and has two logic states. The various logic states have corresponding memory access operation parameters (e.g., threshold voltage levels). A threshold voltage (VT) is the voltage applied to the cell circuitry (e.g., control gate at which a transistor becomes conductive) to set the state of the cell. The cell is set to one of its logic states based on the VT that is applied to the cell. For example, if a high VT is applied to an SLC, a charge will be present in the cell, setting the SLC to store a logic 0. If a low VT is applied to the SLC, charge will be absent in the cell, setting the SLC to store a logic 1.

The threshold voltage (VDM) can be a particular voltage that is applied to memory cells of a memory component to read the data stored at the memory cells. For example, if a threshold voltage of a particular memory cell is identified as being below the threshold voltage that is applied to the particular memory cell, then the data stored at the particular memory cell can be read as a particular value (e.g., a logical '1') or determined to be in a particular state (e.g., a set state). If the threshold voltage of the particular memory cell is identified as being above the threshold voltage, then the data stored at the particular memory cell can be read as another value (e.g., a logical '0') or determined to be in another state (e.g., a reset state). Thus, the threshold voltage can be applied to memory cells to determine values stored at the memory cells. Such threshold voltage can be within a range of threshold voltages or a normal distribution of threshold voltages.

The threshold voltage or the threshold voltage distribution of a memory cell can shift or change over time. When the threshold voltage of a memory cell changes, the application of the threshold voltage can be inaccurate relative to the changed threshold voltage. For example, when the threshold voltage is applied to the memory cell, the data stored at the memory cell can be misread or misinterpreted to be at a wrong value as compared to the value as originally stored when the threshold voltage had not yet shifted. Thus, the threshold voltage and programming voltage (i.e., a voltage applied to write a value to a memory cell) are updated or reset after each time a threshold count of read or write operations has been performed. The memory sub-system can apply pre-determined values for setting the threshold voltage and the programming voltage.

However, there are various factors that cause the memory access operation parameters threshold voltage or its distribution to shift or change. For example, at a given threshold count of read or write operations, the amount of shift or change in the threshold voltage distribution can be different based on operations conditions, such as a temperature and a write-to-write delay (i.e., a period of time between performance of consecutive write operations). Therefore, such a rigid approach of updating the threshold voltage and the programming voltage may not accurately and fully account for the shift or change in the threshold voltage or its distribution.

In some memory sub-systems, the memory access operation parameters (e.g., threshold voltage or current reset voltage) are predefined during the manufacturing process and stored on the memory device and applied to each die of the memory device. The current reset voltage is a reset voltage for setting a state of a memory cell to a reset state. In some memory sub-systems, there are die-to-die variations which can cause significant variations in reliability and/or fail bit count distribution. In particular, each die of a memory device can have different electrical and physical characteristics due to process variation during manufacturing, such as temperature, supply voltage, etc. This "die-to-die variability" results in different error rates for different die subjected to the same operational conditions. Thus, there is no assurance that the predefined VDM provides optimal results with respect to reliability and/or fail bit count distribution.

Aspects of the present disclosure address the above and other deficiencies by having a memory sub-system that determines an optimal threshold voltage and/or other parameters for each die. The memory sub-system performs test on each die with a plurality of parameters to determine which of the plurality of parameter values would result in the optimal data state metric (e.g., the lowest fail bit count distribution). The memory sub-system performs the test by applying one of the plurality of parameter values and performing data pattern writing on the die. The memory sub-system waits a predetermined period of time after the data pattern writing and reads the data from the die. Once the data is read, the memory sub-system measures the fail bit count distribution of the die. The memory sub-system, based on the lowest fail bit count distribution, sets the parameter of the plurality of parameter values associated with the lowest fail bit count distribution to the corresponding die of the memory device that was tested with the plurality of parameter values.

Advantages of the present disclosure include, but are not limited to, improving reliability and performance of the memory device by optimizing a value of a memory access operation parameter (e.g., VDM) at the die level. For example, optimizing VDM for each die of the memory device results in less variation in error rates between different dies. Although embodiments are describe using memory cells of a NAND flash memory, aspect of the present disclosure can be applied to other types of memory sub-systems.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a parameter optimization component 113 that can optimize the predefined memory access operation parameter of the memory device 130, 140 for each die of the memory device 130, 140. In some embodiments, the memory sub-system controller 115 includes at least a portion of the parameter optimization component 113. In some embodiments, the parameter optimization component 113 is part of the host system 110, an application, or an operating system. In other embodiments, local media controller 135 includes at least a portion of parameter optimization component 113 and is configured to perform the functionality described herein.

The parameter optimization component 113 performs tests iteratively for each die of the memory device 130, 140 within a predetermined time period. Each test may involve measuring the value of a chosen data state metric for each memory access operation parameter values for the memory access operation parameter. "Data state metric" herein shall refer to a quantity that is measured or inferred from the state of data stored on a memory device (e.g., metric (parameter value)). Specifically, the data state metrics may reflect the state of the temporal voltage shift, the degree of read disturb, and/or other measurable functions of the data state. One example of a data state metric is the number of data items (e.g., codewords) that exceed a predefined fail bit count with a predetermined write-to-read delay. Another example of a data state metric is the number of host data items that fail error code correcting with a predetermined write to read delay. Other examples include the bit error count (BEC) and the residual bit error rate (RBER) corresponding to the number of bit errors per unit of time (e.g., BEC/total bits read).

Each test includes applying various parameter values to the memory accesses operation parameter (e.g., 16, 32, 64, or 128 parameter values). The parameter optimization component 113 determines from the various parameter values the optimal parameter value of the memory access operation parameter, which can be, e.g., the memory access operation parameter value which, when used in one or more memory access operations, resulted in the lowest number of codewords that exceed a predetermined fail bit count. The parameter optimization component 113 updates the predefined memory access operation parameter with the optimal value. Depending on the embodiment, memory access operation parameters are not limited to a single memory access operation parameter value. For example, threshold voltage (VDM) can have multiple memory access operation parameter values which would result in multiple optimal memory access operation parameter values for different times each corresponding to VDM0, VDM1, and VDM2 used for error recovery flow.

To measure the value of the number of codewords that exceed a predetermined fail bit count for each memory access operation parameter value of the memory access operation parameter, the parameter optimization component 113 can write predefined known data patterns to the die using force write. "Force write," as compared to normal write operation, has slower throughput, higher power consumption, and contributes higher wear to the memory component and is used to clear certain memory disturb effects. The parameter optimization component 113 repeats the data pattern writing for a predetermined number of host data items (e.g., 100, 1000, 10000, or more). After the data pattern writing, the parameter optimization component 113 waits a predetermined period of time. The parameter optimization component 113, after the predetermined period of time, reads the data on the die with each of the memory access operation parameter values of the memory access operation parameter. As a result, the parameter optimization component 113 measures a value of the number of codewords that exceed a predetermined fail bit count for each of the memory access operation parameter values of the memory access operation parameter. Further details with regards to the operations of the parameter optimization component 113 are described below.

FIG. 2 is a flow diagram of an example method 200 to optimize the memory access operation parameter, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the parameter optimization component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic for each value of a plurality of values of a memory access operation parameter, measures a value of a data state metric associated with the value of the plurality of values of the memory access operation parameter used in one or more memory access operations. To measure the value of the data state metric associated with the value of the plurality of values of the memory access operation parameter, the processing logic determines a number of host data that exceeds a predefined fail bit counts with a predetermined write to read delay. The memory access operation parameter includes threshold voltage levels or current reset voltage. The memory access operations include data pattern writing operation and read operation. As described previously, the processing logic can reduce the plurality of values of the memory access operation parameter of by performing a search (e.g., ternary search) to obtain an optimal parameter value from the plurality of values of the memory access operation parameter.

At operation 220, the processing logic selects an optimal metric value based on the measured values of the data state metric. To select the optimal metric value based on the measured values of the data state metric, the processing logic identify a lowest value among the measured values of the data state metric.

At operation 230, the processing logic determines, based on the optimal metric value, an optimal value of the memory access operation parameter from the plurality of values of the memory access operation parameter. The optimal value of the memory access operation parameter refers to the value of the plurality of values with the optimal metric value. The processing logic can further update the memory access operation parameter with the optimal value of the memory access operation parameter.

Figure 3:
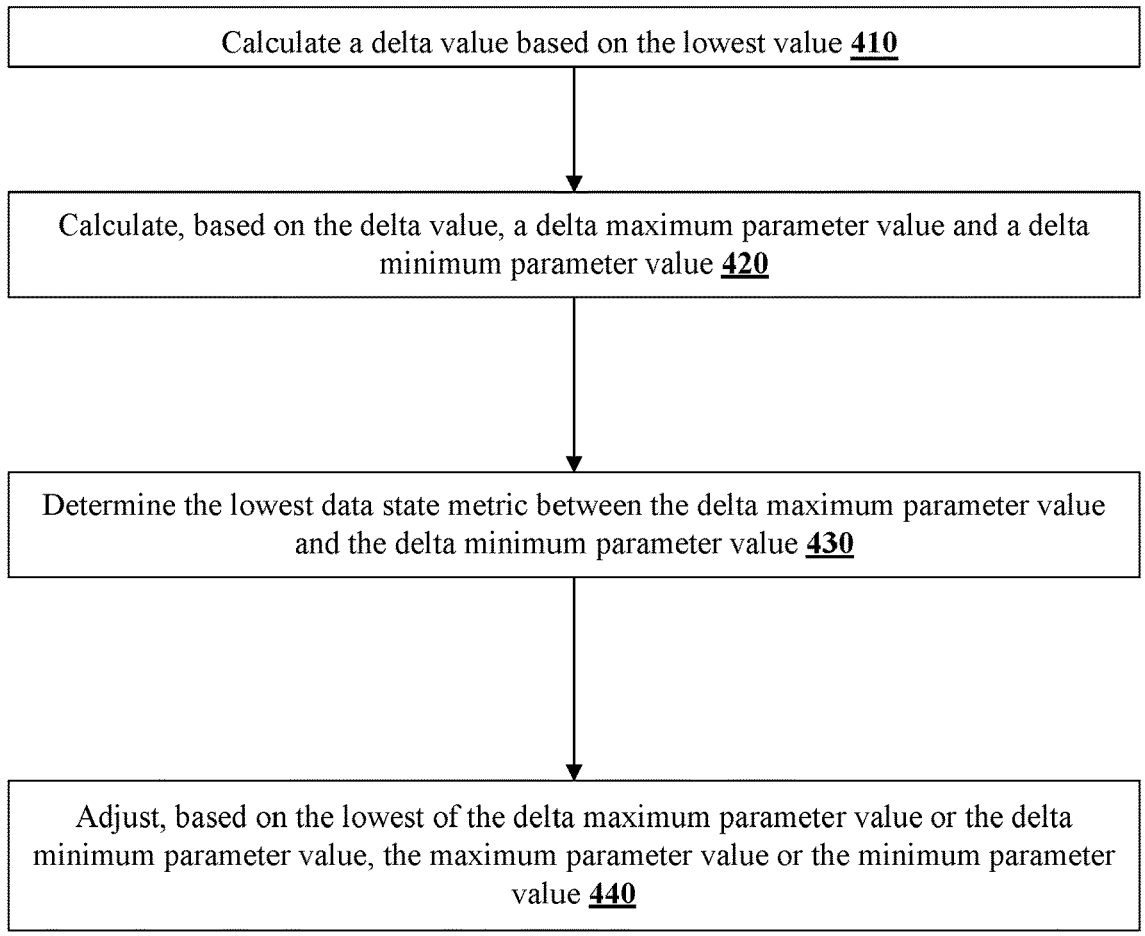
FIG. 3 is a flow diagram of an example method for performing a search to optimize memory access operation parameters in accordance with some embodiments of the present disclosure.

FIG. 3 is a flow diagram of an example method 400 to perform a search to optimize the memory access operation parameter (i.e., ternary search), in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the parameter optimization component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic calculates a delta value (e.g., parameter_delta) based on a lowest value of a plurality of parameter values of a memory access operation parameter. The delta value is based on a parameter_left value corresponding to the minimum memory access operation parameter value of the plurality of memory access operation parameter values and a parameter_right value corresponding to the maximum memory access operation parameter value of the plurality of memory access operation parameter values. To calculate the delta value, the processing logic calculates a floor of the difference between the parameter_right and parameter_left (e.g., floor ((parameter_right−parameter_left)/3)).

At operation 420, the processing logic calculates, based on the delta value, a delta maximum parameter value and a delta minimum parameter value. The delta maximum parameter value (e.g., parameter_right_n) is calculated by subtracting the delta value from parameter_right and delta minimum parameter value (e.g., parameter_left_n) is calculated by adding the delta_value to the parameter_left.

At operation 430, the processing logic determines the lowest data state metric between the delta maximum parameter value and the delta minimum parameter value. To determine the lowest data state metric between the delta maximum parameter value and the delta minimum parameter value, the processing logic measures a value of a data state metric associated with the delta maximum parameter value and the a value of a data state metric associated with the delta minimum parameter value by determining a number of host data items that exceed a predefined fail bit counts with a predetermined write-to-read delay. Once the processing logic measures a data state metric value associated with the delta maximum parameter value and the delta minimum parameter value, the processing logic compares the data state metric associated with the delta maximum parameter value and the data state metric associated with the delta minimum parameter value to determined which has the lowest data state metric value.

At operation 440, the processing logic adjusts the maximum parameter value or the minimum parameter value based on the lowest data state metric among the delta maximum parameter value and the delta minimum parameter value with. If the lowest data state metric corresponds to the delta maximum parameter value, the parameter_right value will be updated with the delta maximum parameter value. If the lowest data state metric corresponds to the delta minimum parameter value, the parameter_left value will be updated with the value of the delta minimum parameter value.

The processing logic will repeat method 400 as long as the absolute difference of the parameter_left and the parameter_right is greater than or equal to a predetermined parameter_step value. The parameter_step value can be, for example, 25 mV or 1 step if the memory access operation parameter is VDM. Once the absolute difference between the parameter_left and the parameter_right is less than the predetermined parameter_step value, the processing logic determines the optimal parameter value (e.g., parameter_optimum) by calculating a floor of the average of the parameter_right and parameter_left (e.g., floor ((parameter_right+ parameter_left)/2)). The optimal parameter value refers to the optimal parameter value from the plurality of memory access operation parameter values.

Figure 4:
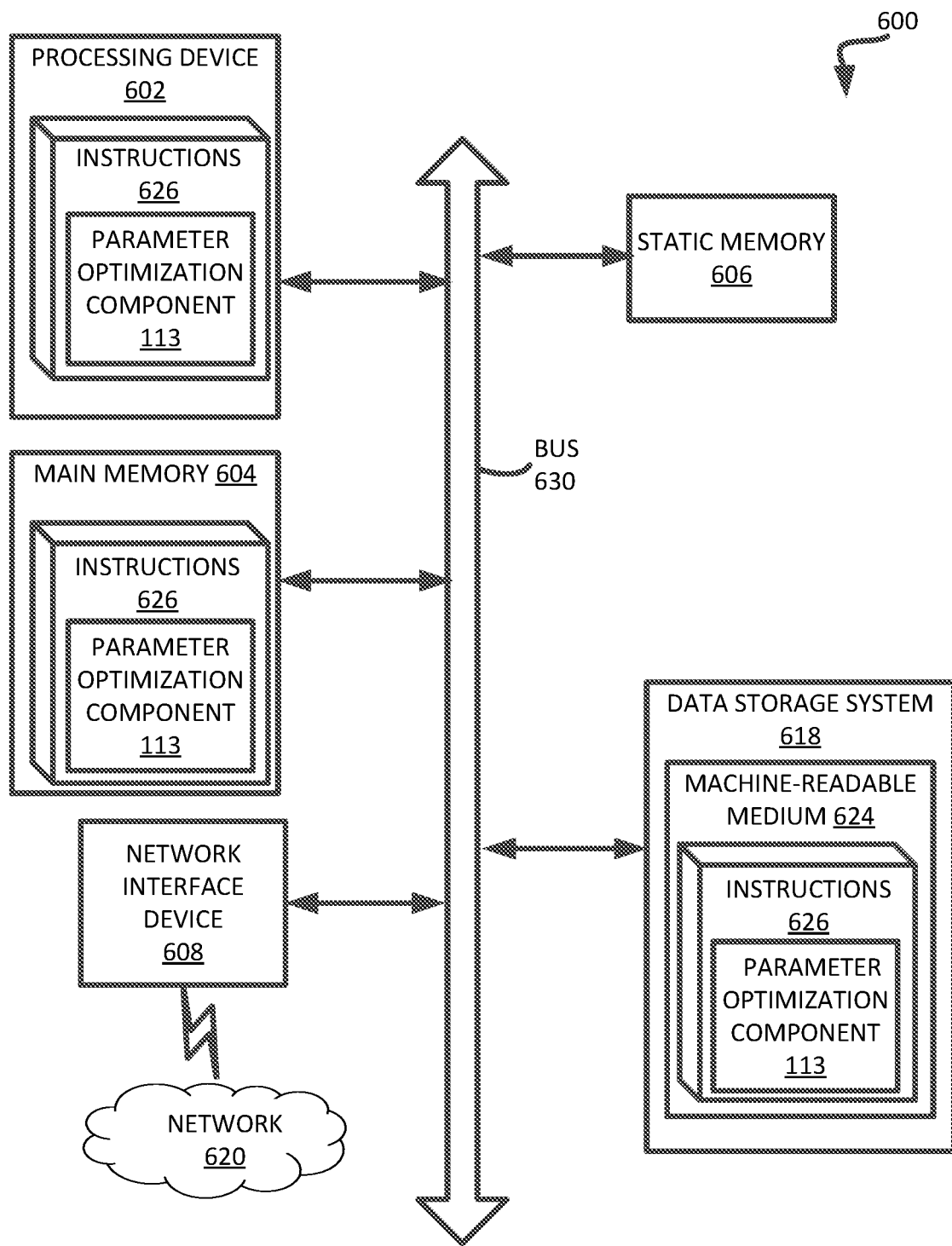
FIG. 4 is a block diagram of an example computer system in which embodiments of the present disclosure may operate.

FIG. 4 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the parameter optimization component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a parameter optimization component (e.g., the parameter optimization component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
writing a predefined data pattern using each value of a plurality of values of a memory access operation parameter;
measuring a corresponding value of a data state metric associated with each value of the plurality of values of the memory access operation parameter; and
selecting, based on the measured values of the data state metric, an optimal value of the memory access operation parameter from the plurality of values of the memory access operation parameter.

2. The system of claim 1, wherein the operations further comprise:
updating the memory access operation parameter with the optimal value of the memory access operation parameter.

3. The system of claim 1, wherein the memory access operation parameter reflects at least one of: a threshold voltage level or a current reset voltage.

4. The system of claim 1, wherein measuring the corresponding value of the data state metric associated with each value of the plurality of values of the memory access operation parameter comprises a search operation on the plurality of values of the memory access operation parameter.

5. The system of claim 1, wherein selecting the optimal metric value based on the measured values of the data state metric comprises identifying a lowest value of the data state metric.

6. The system of claim 1, wherein measuring the corresponding value of the data state metric associated with each value of the plurality of values of the memory access operation parameter comprises determining a number of host data items that exceed a predefined fail bit count.

7. The system of claim 1, wherein the memory access operation comprises one or more of a data write operation or a data read operation.

8. A method comprising:
writing a predefined data pattern using each value of a plurality of values of a memory access operation parameter;
measuring a corresponding value of a data state metric associated with each value of the plurality of values of the memory access operation parameter; and
selecting, based on the measured values of the data state metric, an optimal value of the memory access operation parameter from the plurality of values of the memory access operation parameter.

9. The method of claim 8, further comprising:
updating the memory access operation parameter with the optimal value of the memory access operation parameter.

10. The method of claim 8, wherein the memory access operation parameter reflects at least one of a: threshold voltage levels or a current reset voltage.

11. The method of claim 8, wherein measuring the corresponding value of the data state metric associated with each value of the plurality of values of the memory access operation comprises a search operation on the plurality of values of the memory access operation parameter.

12. The method of claim 8, wherein selecting the optimal metric value based on the measured values of the data state metric comprises identifying a lowest value of the data state metric.

13. The method of claim 8, wherein measuring the corresponding value of the data state metric associated with each value of the plurality of values of the memory access operation parameter comprises determining a number of host data items that exceeds a predefined fail bit count.

14. The method of claim 8, wherein the memory access operation comprises one or more of data write operation or a data read operation.

15. A non-transitory machine-readable storage medium including instructions that, when accessed by a processing device, cause the processing device to:
   calculate a delta value based on a lowest memory access operation parameter value of a plurality of memory access operation parameter values of a memory access operation parameter;
   calculate, based on the delta value, a delta maximum parameter value and a delta minimum parameter value;
   write a predefined data pattern using the delta maximum parameter value and the delta minimum parameter value;
   measure a corresponding value of a data metric associated with the delta maximum parameter value and the delta minimum parameter value; and
   adjust, based on the measured values of the data metric, a maximum parameter value or a minimum parameter value.

16. The non-transitory machine-readable storage medium of claim 15, wherein the lowest memory access operation parameter value is determined based on a minimum memory access operation parameter value and a maximum memory access operation parameter value of the plurality of memory access operation parameter values.

17. The non-transitory machine-readable storage medium of claim 15, wherein calculating the delta maximum parameter value comprises adding the delta value to a maximum memory access operation parameter value and wherein calculating the delta minimum parameter value comprises adding the delta value to a minimum memory access operation parameter value.

18. The non-transitory machine-readable storage medium of claim 15, wherein calculating the delta value comprises calculating a floor of the maximum memory access operation parameter value and the minimum memory access operation parameter value.

19. The non-transitory machine-readable storage medium of claim 15, further causing the processing device to:
   calculate, based on an adjusted maximum memory access operation parameter value and an adjusted minimum memory access operation parameter value, an optimal parameter value.

20. The non-transitory machine-readable storage medium of claim 15, wherein the memory access operation parameter reflects at least one of: a threshold voltage level or a current reset voltage.

* * * * *